United States Patent
Nishida

(10) Patent No.: US 8,476,983 B2
(45) Date of Patent: Jul. 2, 2013

(54) OPTICAL MODULE AND ATOMIC OSCILLATOR

(75) Inventor: Tetsuo Nishida, Suwa (JP)

(73) Assignee: Seiko Epson Corporation (JP)

( * ) Notice: Subject to any disclaimer, the term of this patent is extended or adjusted under 35 U.S.C. 154(b) by 19 days.

(21) Appl. No.: 13/162,916

(22) Filed: Jun. 17, 2011

(65) Prior Publication Data

US 2012/0013411 A1 Jan. 19, 2012

(30) Foreign Application Priority Data

Jul. 14, 2010 (JP) ................................. 2010-159505

(51) Int. Cl.
*H03B 17/00* (2006.01)

(52) U.S. Cl.
USPC ............................................. 331/94.1; 331/3

(58) Field of Classification Search
USPC ............................ 331/3, 94.1; 372/26, 69–74
See application file for complete search history.

(56) References Cited

U.S. PATENT DOCUMENTS

| | | | |
|---|---|---|---|
| 3,546,622 A * | 12/1970 | Yariv et al. | 372/108 |
| 3,720,882 A * | 3/1973 | Tang et al. | 331/3 |
| 4,733,397 A * | 3/1988 | Gallagher et al. | 372/26 |
| 6,363,091 B1 | 3/2002 | Zhu et al. | |
| 6,993,058 B2 * | 1/2006 | Zhu | 372/106 |
| 7,098,744 B2 * | 8/2006 | Hayes | 331/3 |
| 7,378,913 B2 * | 5/2008 | Laiacano et al. | 331/3 |
| 8,237,514 B2 * | 8/2012 | Aoyama et al. | 331/94.1 |
| 8,314,661 B2 * | 11/2012 | Chindo | 331/94.1 |
| 2002/0163394 A1 | 11/2002 | Hollberg et al. | |

FOREIGN PATENT DOCUMENTS

| | | |
|---|---|---|
| EP | 1 473 605 | 11/2004 |
| JP | 2009-089116 | 4/2009 |

OTHER PUBLICATIONS

Extended European Search Report for Application No. 11 17 3564.3 mailed Nov. 15, 2011 (5 pages).

* cited by examiner

*Primary Examiner* — Levi Gannon
(74) *Attorney, Agent, or Firm* — Harness, Dickey & Pierce, P.L.C.

(57) ABSTRACT

An optical module of an atomic oscillator using a quantum interference effect includes a light source to generate first light including a fundamental wave having a center wavelength, and including a first sideband wave and a second sideband wave having wavelengths that are different from each other, a wavelength selection unit that emits second light by selecting the first sideband wave and the second sideband wave of the first light and by allowing them to pass through, a gas cell in which an alkali metal gas is sealed and to which the second light is irradiated, and a light detection unit that detects an intensity of the second light passing through the gas cell.

16 Claims, 5 Drawing Sheets

OPTICAL MODULE AND ATOMIC OSCILLATOR

This application claims priority to Japanese Patent Application No. 2010-159505 filed Jul. 14, 2010 which is hereby expressly incorporated by reference herein in its entirety.

BACKGROUND

1. Technical Field

The present invention relates to an optical module and an atomic oscillator.

2. Related Art

In recent years, an atomic oscillator using Coherent Population Trapping (CPT) as a quantum interference effect has been proposed, and a reduction in size and a reduction in power consumption are expected. An atomic oscillator using CPT: uses a phenomenon known as Electromagnetically Induced Transparency (EIT) in which when two resonant lights that have different wavelengths (frequency) are simultaneously irradiated onto an alkali metal atom, absorption of the two resonant lights is stopped. For example, JP-A-2009-89116 discloses an atomic oscillator using CPT, and includes an optical module including a light source to emit coherent light, a gas cell in which alkali metal atoms are sealed, and a light-receiving element to detect the intensity of the light passing through the gas cell.

In an atomic oscillator using CPT, for example, a semiconductor laser can be used as a light source. In an atomic oscillator using a semiconductor laser as the light source, for example, a drive current of the semiconductor laser is modulated to generate sideband waves in the light emitted from the semiconductor laser, and the EIT phenomenon is caused.

However, the light emitted from the semiconductor laser in which the drive current is modulated includes not only the sideband waves, but also a fundamental wave (carrier wave) having a center wavelength which does not contribute to the EIT phenomenon. When the fundamental wave is irradiated onto the alkali metal atom, the wavelength (frequency) of light absorbed by the alkali metal atom is changed (known as the AC Stark effect) so that the frequency stability of the atomic oscillator is lowered.

SUMMARY

An advantage of some aspects of the invention is to provide an optical module by which an atomic oscillator having high frequency stability can be obtained. Another advantage of some aspects of the invention is to provide an atomic oscillator including the optical module discussed above.

According to one aspect of the invention, an optical module of an atomic oscillator using a quantum interference effect includes a light source to generate first light including a fundamental wave having a center wavelength, and a first sideband wave and a second sideband wave having wavelengths that are different from each other. The optical module further includes a wavelength selection unit that emits second light by selecting the first sideband wave and the second sideband wave of the first light and by allowing them to pass through, a gas cell in which an alkali metal gas is sealed and to which the second light is irradiated, and a light detection unit that detects an intensity of the second light passing through the gas cell.

According to such an optical module, the wavelength selection unit can reduce the intensity of the fundamental wave of the first light or can eliminate the fundamental wave. In this way, it is possible to restrain or prevent the fundamental wave, which does not contribute to the EIT phenomenon, from being irradiated onto the alkali metal atom. Accordingly, the frequency variation due to the AC Stark effect can be restrained, and an oscillator having high frequency stability can be provided.

It is preferable that in the optical module, the wavelength selection unit is an etalon.

According to such an optical module, the wavelength selection unit can be configured with a simple structure.

It is preferable that in the optical module, the etalon includes a first mirror and a second mirror that reflect the first light and that face each other, and a base plate disposed between the first mirror and the second mirror. A material of the base plate is preferably a compound semiconductor.

According to such an optical module, the distance between the first mirror and the second mirror can be shortened so that the apparatus can be miniaturized.

It is preferable that the optical module further includes a substrate that is made of a compound semiconductor material, that the light source is a semiconductor laser, and that the etalon and the light source are formed on the substrate.

According to such an optical module, since the etalon and the light source are formed on the same substrate, the apparatus can be miniaturized.

It is preferable that in the optical module, the base plate of the etalon includes a first layer, a second layer and a third layer in this order from a side of the substrate. A refractive index of the first layer and a refractive index of the third layer are smaller than a refractive index of the second layer. The second layer can transmit the first light.

According to such an optical module, the base plate can be made as an optical waveguide. Accordingly, the beam diameter of the second light emitted from the wavelength selection unit can be controlled so that the second light can be efficiently irradiated to the gas cell.

It is preferable that in the optical module, the light source is an edge emitting laser.

According to such an optical module, relative locational alignment between the light source (edge emitting laser) and the wavelength selection unit can be performed by controlling the film thicknesses of the layers configuring the edge emitting laser. Further, for example, an optical device for causing the first light to be incident on the wavelength conversion unit formed on the same substrate becomes unnecessary. Accordingly, alignment accuracy between the light source and the wavelength selection unit can be improved.

It is preferable that in the optical module, the light source is a surface emitting laser.

According to such an optical module, since a current to produce a gain in the surface emitting laser, is small as compared with the edge emitting laser, power consumption can be reduced.

It is preferable that in the optical module, the wavelength selection unit is a fiber grating.

According to such an optical module, since the fiber grating can be easily deformed, the degree of design freedom can be improved.

According to another aspect of the invention, an atomic oscillator includes the optical module discussed above.

Since the atomic oscillator includes the optical module discussed above, frequency variation due to the AC Stark effect can be restrained, and frequency stability can be improved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the drawings.

Figure 1:
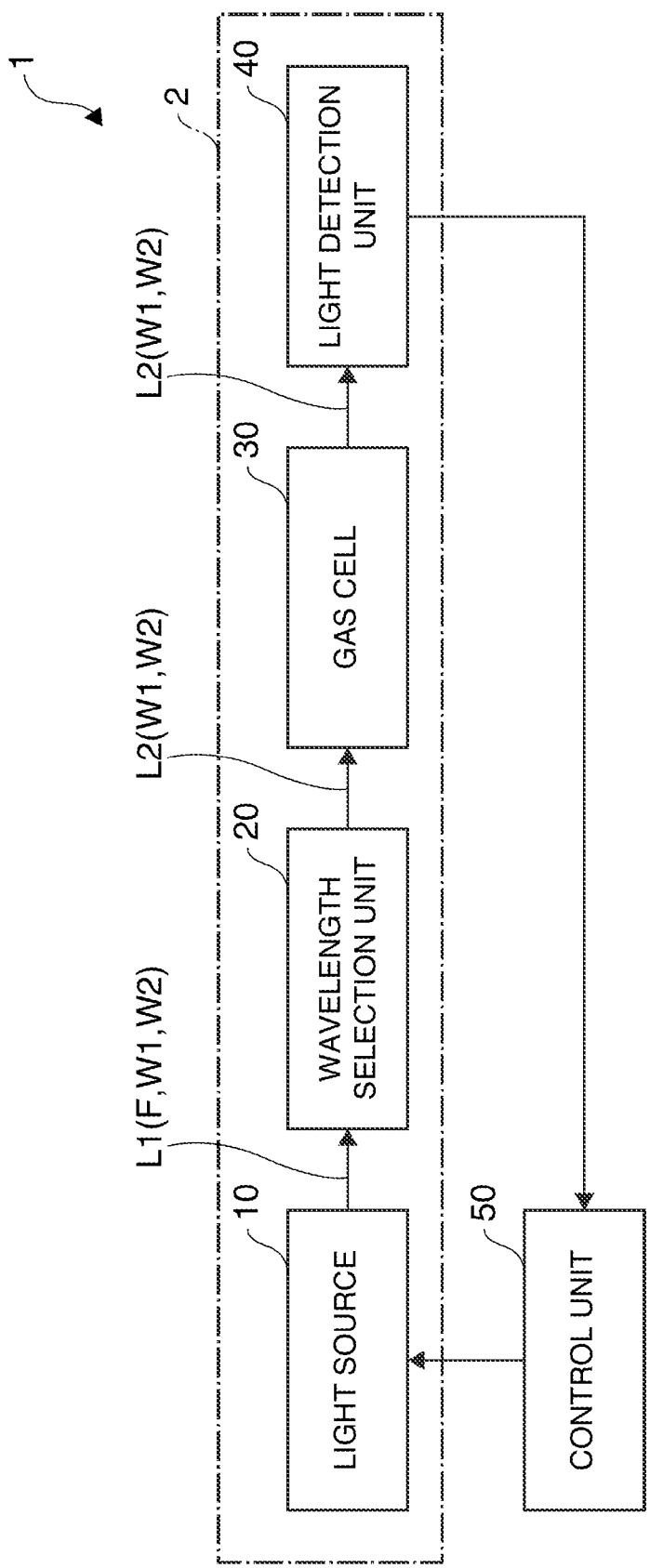
FIG. 1 is a function block diagram of an atomic oscillator.

First, an optical module and an atomic oscillator of one embodiment will be described with reference to the drawings. The atomic oscillator of this embodiment includes an optical module of the embodiment. FIG. 1 is a function block diagram of an atomic oscillator 1 of the embodiment.

The atomic oscillator 1 includes an optical module 2 and a control unit 50.

The optical module 2 includes a light source 10, a wavelength selection unit 20, a gas cell 30 and a light detection unit 40.

The light source 10 generates first light L1 including a fundamental wave F having a center wavelength (center frequency), and a first sideband wave W1 and a second sideband wave W2 having wavelengths that are different from each other.

The wavelength selection unit 20 selects the first sideband wave W1 and the second sideband wave W2 of the first light L1 and allows them to pass through, and emits second light L2.

An alkali metal gas is sealed in the gas cell 30. The second light L2 is irradiated to the gas cell 30.

The light detection unit 40 detects the intensity of the second light L2 passing through the gas cell 30.

The control unit 50 controls the light source 10/the optical module 2, based on a detection result of the light detection unit 40, so that a wavelength (frequency) difference between the first sideband wave W1 and the second sideband wave W2 is equal to a frequency corresponding to an energy difference between two ground levels of the alkali metal atoms sealed in the gas cell 30. Specifically, the control unit 50 generates a detection signal having a modulation frequency $f_m$ based on the detection result of the light detection unit 40. The light source 10 modulates the fundamental wave F having a specified frequency $f_0$ based on the modulation signal, and generates the first sideband wave W1 having a frequency, $f_1=f_0+f_m$, and the second sideband wave W2 having a frequency, $f_2=f_0-f_m$.

Figure 2A:
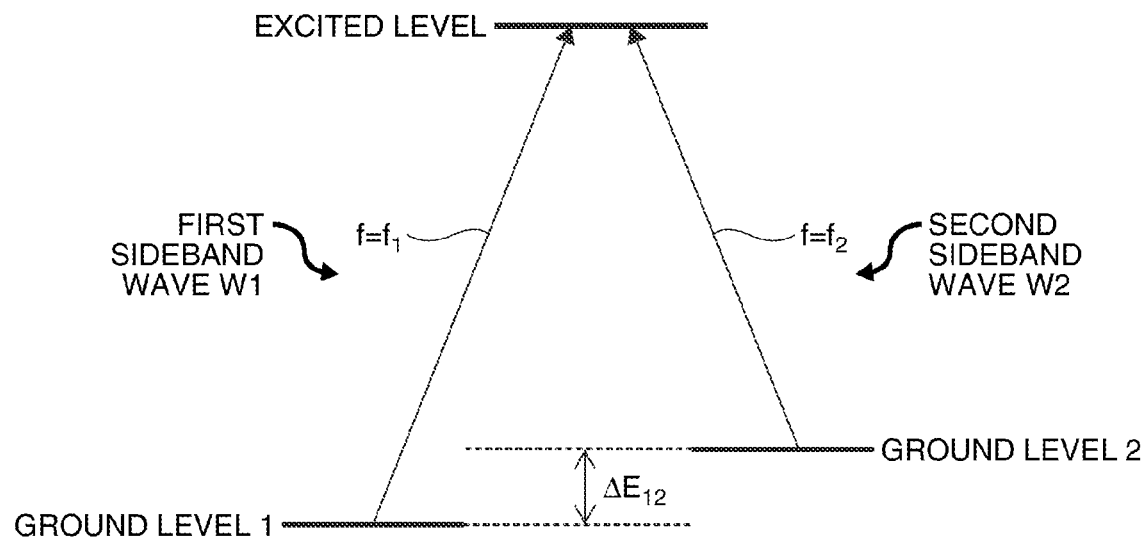
FIG. 2A is a view showing a Λ-type three-level model of an alkali metal atom and a relation between a first sideband wave and a second sideband wave.
Figure 2B:
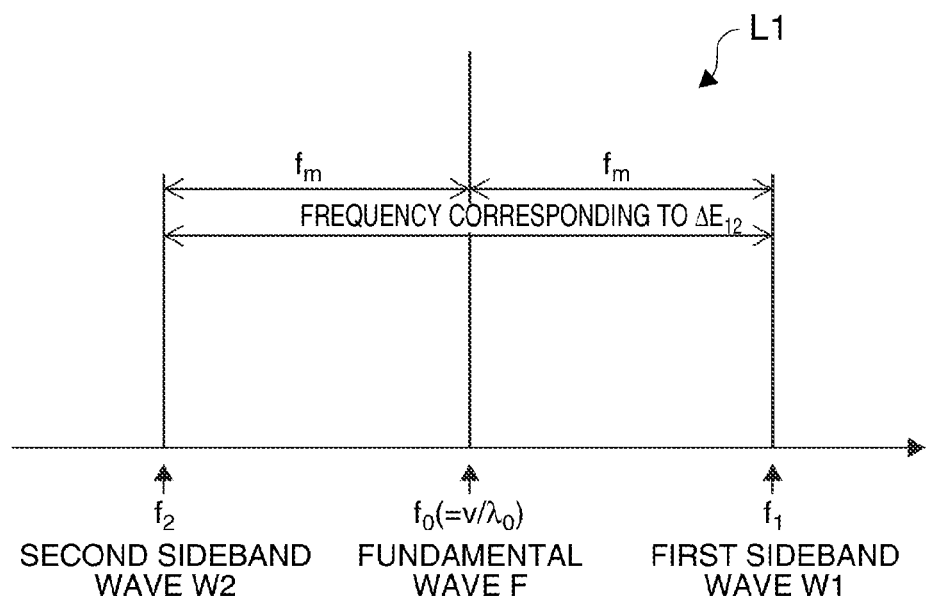
FIG. 2B is a view showing a frequency spectrum of first light generated in a light source.

FIG. 2A is a view showing a Λ-type three-level model of the alkali metal atom and a relation between the first sideband wave W1 and the second sideband wave W2. FIG. 2B is a view showing a frequency spectrum of the first light L1 generated in the light source 10.

As shown in FIG. 2B, the first light L1 generated in the light source 10 includes the fundamental wave F having the center frequency $f_0$ ($f_0=v/\lambda_0$: v is light speed; and $\lambda_0$ is a center wavelength of laser light), the first sideband wave W1 having the frequency $f_1$ in an upper sideband relative to the center frequency $f_0$, and the second sideband wave W2 having the frequency $f_2$ in a lower sideband relative to the center frequency $f_0$. The frequency $f_1$ of the first sideband wave W1 is expressed in the following equation: $f_1=f_0+f_m$. The frequency $f_2$ of the second sideband wave W2 is expressed in the following equation: $f_2=f_0-f_m$.

As shown in FIG. 2A and FIG. 2B, a frequency difference between the frequency $f_1$ of the first sideband wave W1 and the frequency $f_2$ of the second sideband wave W2 coincides with a frequency corresponding to an energy difference $\Delta E_{12}$ between a ground level 1 and a ground level 2 of the alkali metal atom. Accordingly, the alkali metal atom causes the EIT phenomenon by the first sideband wave W1 having the frequency $f_1$ and the second sideband wave W2 having the frequency $f_2$.

Next, the EIT phenomenon will be described. It is known that an interaction between an alkali metal atom and light can be explained in a Λ-type three-level model. As shown in FIG. 2A, the alkali metal atom has two ground levels 1 and 2. When the first sideband wave W1 having the wavelength (frequency $f_1$) corresponding to the energy difference between the ground level 1 and an excited level or the second sideband wave W2 having the wavelength (frequency $f_2$) corresponding to the energy difference between the ground level 2 and the excited level is individually irradiated onto the alkali metal atom, light absorption occurs. However, when the first sideband wave W1 and the second sideband wave W2 in which the frequency difference $f_1-f_2$ accurately coincides with the frequency corresponding to the energy difference $\Delta E_{12}$ between the ground level 1 and the ground level 2 are simultaneously irradiated onto the alkali metal atom, a superposition state of the two ground levels, i.e. the quantum interference state, occurs; an excitation to the excited level is stopped; and a transparency phenomenon (EIT phenomenon) occurs in which the first sideband wave W1 and the second sideband wave W2 pass through the alkali metal atom. This EIT phenomenon is used and an oscillator with high accuracy can be formed by detecting and controlling the abrupt change of light absorption behavior when the frequency difference $f_1-f_2$ between the first sideband wave W1 and the second sideband wave W2 deviates from the frequency corresponding to the energy difference $\Delta E_{12}$ between the ground level 1 and the ground level 2.

Figure 3:
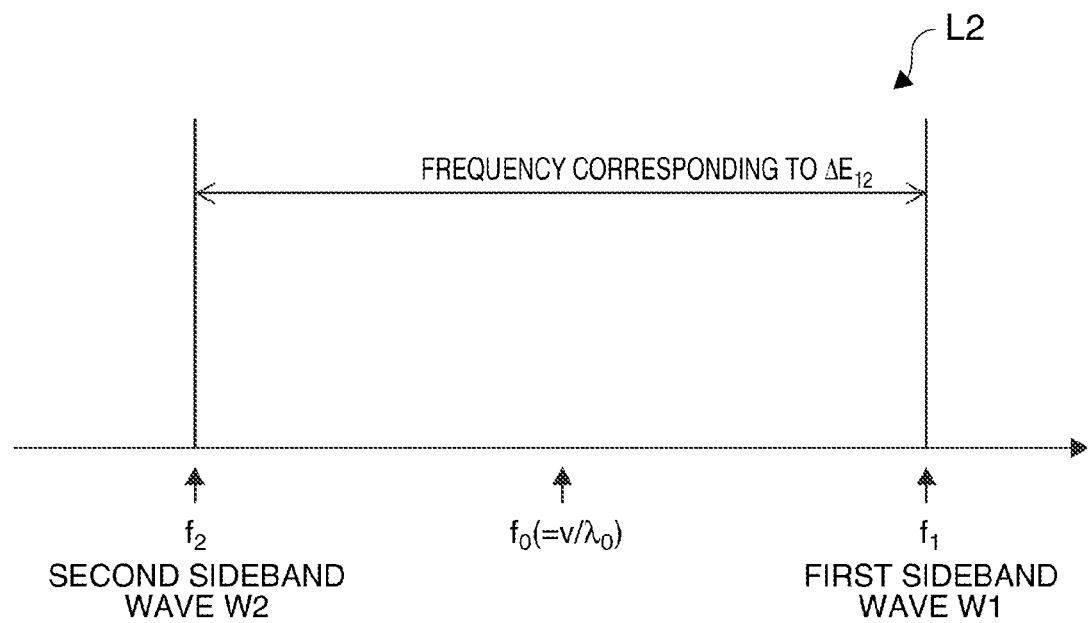
FIG. 3 is a view showing a frequency spectrum of second light emitted from a wavelength selection unit.

FIG. 3 is a view showing a frequency spectrum of the second light L2 emitted from the wavelength selection unit 20.

As compared with the first light L1, the second light L2 is light in which the fundamental wave F is eliminated or the intensity of the fundamental wave F is reduced. In FIG. 3, the second light L2 includes only the first sideband wave W1 having the frequency $f_1$ in the upper sideband relative to the center frequency $f_0$ and the second sideband wave W2 having the frequency $f_2$ in the lower sideband relative to the center frequency $f_0$. As stated above, in the optical module 2, the intensity of the fundamental wave F can be reduced or the fundamental wave F can be eliminated by the wavelength selection unit 20.

Hereinafter, a more specific structure of the atomic oscillator of the embodiment will be described.

Figure 4:
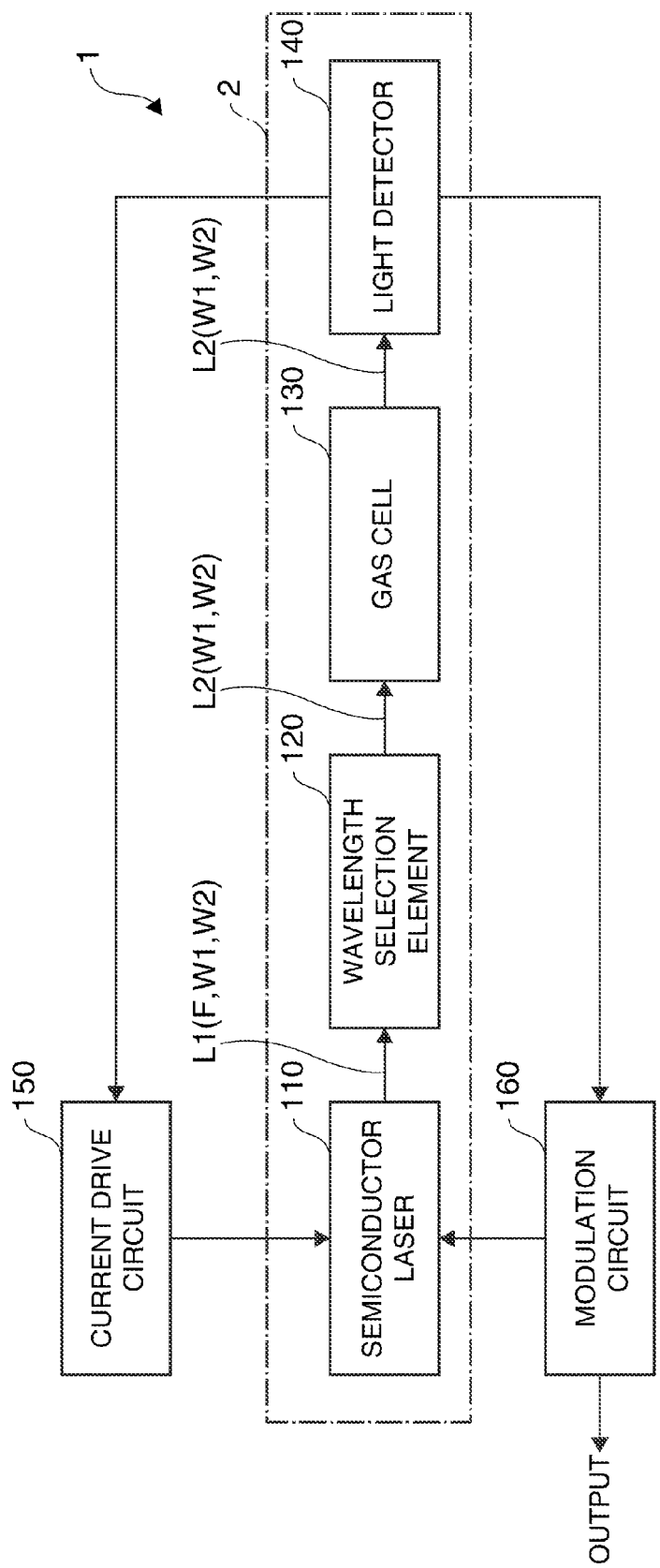
FIG. 4 is a block diagram showing a structure of an atomic oscillator.

FIG. 4 is a block diagram showing a structure of an atomic oscillator 1.

As shown in FIG. 4, the atomic oscillator 1 includes an optical module 2, a current drive circuit 150 and a modulation circuit 160.

The optical module 2 includes a semiconductor laser 110, a wavelength selection element 120, a gas cell 130 and a light detector 140.

The semiconductor laser 110 emits first light L1 including a fundamental wave F having a center wavelength, and a first sideband wave W1 and a second sideband wave W2 having wavelengths that are different from each other. In the laser light (first light L1) emitted by the semiconductor laser 110, the center frequency $f_0$ (center wavelength $\lambda_0$) is controlled by a drive current outputted by the current drive circuit 150, and is modulated by an output signal (modulation signal) of the modulation circuit 160. In other words, the first light L1 emitted by the semiconductor laser 110 can be modulated by superimposing an alternate current having a frequency component of the modulation signal on the drive current of the current drive circuit 150. Therefore, the first sideband wave W1 and the second sideband wave W2 are generated in the first light L1. Since light generated by the semiconductor laser 110 has coherence, this light is preferable for obtaining the quantum interference effect.

As shown in FIG. 2B, the first light L1 includes the fundamental wave F having the center frequency $f_0$ ($f_0=v/\lambda_0$: v is light speed; and $\lambda_0$ is a center wavelength of the first light L1), the first sideband wave W1 having the frequency $f_1$ in the upper sideband relative to the center frequency $f_0$, and the second sideband wave W2 having the frequency $f_2$ in the lower sideband relative to the center frequency $f_0$. The frequency $f_1$ of the first sideband wave W1 is expressed in the following equation: $f_1=f_0+f_m$. The frequency $f_2$ of the second sideband wave W2 is expressed in the following equation: $f_2=f_0-f_m$.

The wavelength selection element 120 selects the first sideband wave W1 and the second sideband wave W2 of the first light and allows them to pass through. In other words, the wavelength selection element 120 has high transmittance to the first sideband wave W1 and the second sideband wave W2 and has low transmittance to the fundamental wave F. Therefore, the intensity of the fundamental wave F of the first light L1 incident on the wavelength selection element 120 is reduced or the fundamental wave F is eliminated; and the second light L2 can be emitted. As compared with the first light L1, in the second light L2, the intensity of the fundamental wave F is reduced or the fundamental wave F is eliminated. In FIG. 3, the second light L2 includes only the first sideband wave W1 having the frequency $f_1$ in the upper sideband relative to the center frequency $f_0$, and the second sideband wave W2 having the frequency $f_2$ in the lower sideband relative to the center frequency $f_0$.

The wavelength selection element 120 may be an etalon as described later, or may be a fiber grating.

The gas cell 130 is a container in which gaseous alkali metal atoms (sodium (Na) atoms, rubidium (Rb) atoms, cesium (Cs) atoms, etc.) are sealed. The second light L2 is irradiated to the gas cell 130.

When two light waves (first sideband wave and second sideband wave), in which a frequency difference equal to a frequency (wavelength) corresponding to an energy difference between two ground levels of the alkali metal atom, are irradiated to the gas cell 130, the alkali metal atom causes the EIT phenomenon. For example, when the alkali metal atom is a cesium atom, since the frequency corresponding to the energy difference between the ground level 1 and the ground level 2 in the D1 line is 9.19263 . . . GHz, when two light waves having a frequency difference of 9.19263 . . . GHz are irradiated, the EIT phenomenon occurs.

The light detector 140 detects the second light L2 passing through the gas cell 130, and outputs a signal having signal intensity corresponding to the amount of the detected light. The output signal of the light detector 140 is input to the current drive circuit 150 and the modulation circuit 160. The light detector 140 may be a photodiode.

The current drive circuit 150 generates a drive current having a magnitude corresponding to the output signal of the light detector 140, and supplies it to the semiconductor laser 110 to control the center frequency $f_0$ (center wavelength $\lambda_0$) of the first light L1.

The center frequency $f_0$ (center wavelength $\lambda_0$) of the first light L1 is finely adjusted by a feedback loop passing through the semiconductor laser 110, the wavelength selection element 120, the gas cell 130, the light detector 140 and the current drive circuit 150 and is stabilized.

The modulation circuit 160 generates the modulation signal having the modulation frequency $f_m$ corresponding to the output signal of the light detector 140. The modulation signal is supplied to the semiconductor laser 110 while the modulation frequency $f_m$ is finely adjusted so that the output signal of the light detector 140 becomes a maximum value. The laser light emitted by the semiconductor laser 110 is modulated by the modulation signal. The first sideband wave W1 and the second sideband wave W2 are generated.

Note that the semiconductor laser 110, the wavelength selection element 120, the gas cell 130 and the light detector 140 in FIG. 4 respectively correspond to the light source 10, the wavelength selection unit 20, the gas cell 30 and the light detection unit 40 in FIG. 1. In addition, the current drive circuit 150 and the modulation circuit 160 in FIG. 4 correspond to the control unit 50 in FIG. 1.

In the atomic oscillator 1 having the structure as described above, when the frequency difference between the first sideband wave W1 and the second sideband wave W2 of the first light L1 generated by the semiconductor laser 110 does not accurately coincide with the frequency corresponding to the energy difference between the two ground levels 1 and 2 of the alkali metal atom, the alkali metal atom does not cause the EIT phenomenon. Thus, the detection amount of the light detector 140 is changed very sensitively according to the frequencies of the first sideband wave W1 and the second sideband wave W2. Therefore, feedback control is performed by a feedback loop passing through the semiconductor laser 110, the wavelength selection element 120, the gas cell 130, the light detector 140 and the modulation circuit 160 so that the frequency difference between the first sideband wave W1 and the second sideband wave W2 very accurately coincides with the frequency corresponding to the energy difference between the two ground levels 1 and 2 of the alkali metal atom. As a result, since the modulation frequency becomes the very stable frequency, the modulation signal can contribute the output signal (clock output) of the atomic oscillator 1.

Figure 5:
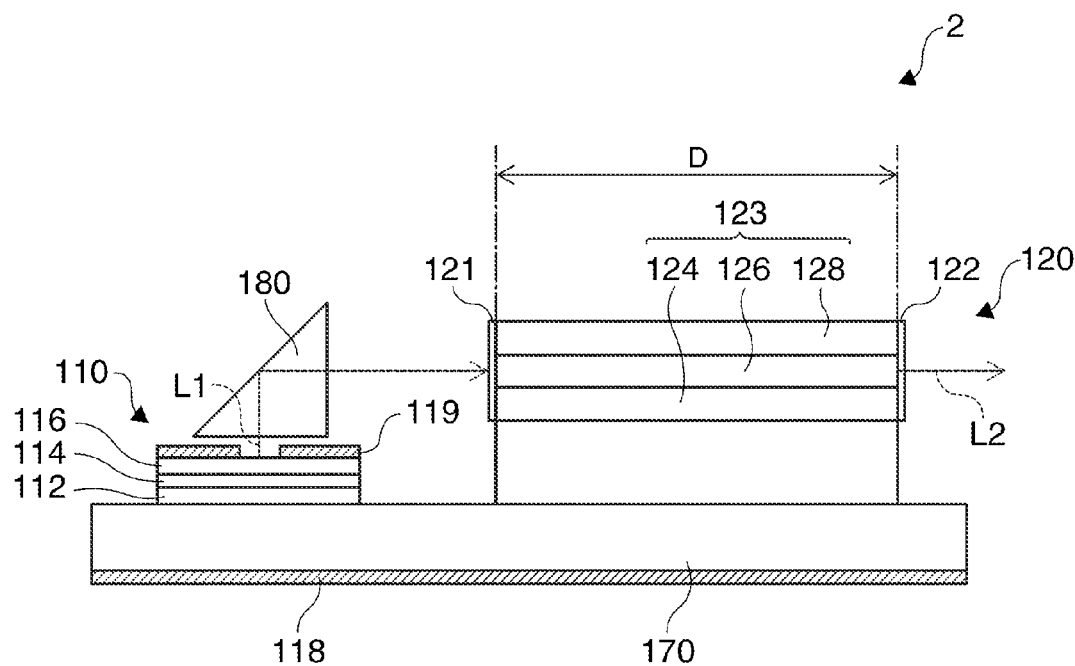
FIG. 5 is a sectional view schematically showing part of an optical module.

FIG. 5 is a sectional view schematically showing part (the semiconductor laser 110 and the wavelength selection element 120) of the optical module 2.

As shown in FIG. 5, the optical module 2 further includes a substrate 170. The semiconductor laser 110 and the wavelength selection element 120 are formed on the substrate 170. Since the semiconductor laser 110 and the wavelength selection element 120 are formed monolithically as stated above, the apparatus can be miniaturized.

The substrate 170 is made of a compound semiconductor material. Specifically, the material of the substrate 170 is, for example, a III-V group semiconductor such as GaAs, InP or GaN, or a II-VI group semiconductor such as ZnO or ZnSe. In this embodiment, a description will be made on a case where the material of the substrate 170 is first conductivity type (for example, n type) GaAs.

The semiconductor laser 110 is a surface emitting laser including a first semiconductor layer 112, an active layer 114 and a second semiconductor layer 116.

The first semiconductor layer 112 is formed on the substrate 170. The first semiconductor layer 112 is, for example, a distributed Bragg reflection (DBR) semiconductor mirror in which an n-type (first conductivity type) $Al_{0.9}Ga_{0.1}As$ layer and an n-type $Al_{0.15}Ga_{0.85}As$ layer are alternately laminated.

The active layer 114 is formed on the first semiconductor layer 112. The active layer 114 has, for example, a multiple quantum well (MQW) structure in which three quantum well structures each including a GaAs well layer and an $Al_{0.3}Ga_{0.7}As$ barrier layer overlap.

The second semiconductor layer 116 is, for example, a DBR semiconductor mirror in which a p-type (second conductivity type) $Al_{0.15}Ga_{0.85}As$ layer and a p-type $Al_{0.9}Ga_{0.1}As$ layer are alternately laminated.

A pin diode is formed of the p-type second semiconductor layer 116, the active layer 114 not doped with impurity, and the n-type first semiconductor layer 112.

A first electrode 118 is formed on a lower surface of the substrate 170. The first electrode 118 is electrically connected to the first semiconductor layer 112 through the substrate 170. The first electrode 118 is one electrode for driving the semiconductor laser 110.

A second electrode 119 is formed on an upper surface of the second semiconductor layer 116. The second electrode 119 is electrically connected to the second semiconductor layer 116. The second electrode 119 is the other electrode for driving the semiconductor laser 110.

When a voltage in a forward direction is applied to the pin diode by the first electrode 118 and the second electrode 119, recombination of an electron and a hole occurs in the active layer 114, and light emission by the recombination occurs. When the generated light reciprocates between the second semiconductor layer 116 and the first semiconductor layer 112, stimulated emission occurs, and the intensity of the light is amplified. When the light gain becomes larger than the light loss, the laser oscillation occurs, and the laser light (first light L1) is emitted from the upper surface of the second semiconductor layer 116. The light L1 emitted from the semiconductor laser 110 is reflected by a prism 180 and is incident on the wavelength selection element 120. The prism 180 is an optical element that changes a traveling direction of the first light L1 and causes the first light L1 to be incident on the wavelength selection element 120.

In the optical module 2, the wavelength selection element 120 is an etalon. The wavelength selection element 120 includes a first mirror 121, a second mirror 122, and a base plate 123 disposed between the first mirror 121 and the second mirror 122.

The wavelength selection element 120 allows light having a specified wavelength (first sideband wave W1 and second sideband wave W2) in the incident light to pass through by an interference action. When light is incident on the base plate 123 between the first mirror 121 and the second mirror 122, the light having a wavelength corresponding to a length (distance between the first mirror 121 and the second mirror 122) D of the base plate 123 and a refractive index of the base plate 123 selectively passes through the wavelength selection element 120 by the interference action. The wavelength selection element 120 has high transmittance to the first sideband wave W1 and the second sideband wave W2, and has low transmittance to the fundamental wave F. Therefore, the intensity of the fundamental wave F of the first light L1 incident on the wavelength selection element 120 can be reduced or the fundamental wave F can be eliminated.

Accordingly, the wavelength selection element 120 can emit the second light L2 including, for example, only the first sideband wave W1 and the second sideband wave W2.

The first mirror 121 and the second mirror 122 face each other through the base plate 123. Each of the first mirror 121 and the second mirror 122 is made of, for example, a multilayer film in which a $Ta_2O_5$ film and a $SiO_2$ film are alternately laminated.

The base plate 123 is formed on the substrate 170. The base plate 123 includes a first layer 124, a second layer 126 and a third layer 128 formed in this order from a side of the substrate 170. In the base plate 123, a refractive index of the first layer 124 and a refractive index of the third layer 128 are smaller than the refractive index of the second layer 126. Accordingly, the first layer 124 and the third layer 128 function as clad layers, and the second layer functions as a core layer to transmit the first light L1. In other words, the base plate 123 is an optical waveguide for transmitting the first light L1. In the optical module 2, since the base plate 123 is the optical waveguide, the beam diameter of the light L2 emitted from the wavelength selection element 120 can be controlled, and the light can be efficiently irradiated to the gas cell 130.

A material of the first layer 124 and the third layer 128 is, for example, AlGaAs. A material of the second layer 126 is, for example, GaAs.

A material of the base plate 123 is not particularly limited, and may be a III-V group semiconductor such as GaAs, InP or GaN or a II-VI group semiconductor such as ZnO or ZnSe. When, for example, GaAs is used as the material of the base plate 123, and when a free spectral range is 9.2 GHz, and a full width at half maximum is 0.3 GHz, the length D of the base plate 123 is about 28.5 mm. When typical $SiO_2$ is used as a material of the base plate 123 of the etalon, the length of the base plate 123 is about 70.66 mm. As stated above, when the compound semiconductor having a high refractive index is used as the material of the base plate 123, the length D of the base plate 123 can be shortened.

Note that the optical waveguide may not be formed in the base plate 123. The base plate 123 may not include the plural layers 124, 126 and 128 but may have a single layer.

In this embodiment, although a description is made regarding a case where the wavelength selection element 120 is the etalon, the wavelength selection element 120 may be a fiber grating in which a periodic refractive index change is given to the core of an optical fiber in its longitudinal direction. Since the fiber grating uses the optical fiber, deformation is easy and a degree of design freedom can be improved.

The optical module 2 and the atomic oscillator 1 have, for example, the following features.

According to the optical module 2, the wavelength selection element 120 can reduce the intensity of the fundamental wave F of the first light L1 or can eliminate the fundamental wave F. Therefore, it is possible to restrain or prevent the fundamental wave F, which does not contribute to the FIT phenomenon, from being irradiated onto the alkali metal atom. Accordingly, the frequency variation due to the AC Stark effect can be restrained, and the oscillator having high frequency stability can be provided.

According to the optical module 2, the wavelength selection element 120 is the etalon. Accordingly, the wavelength selection element 120 can be configured with a simple structure. In addition, the material of the base plate 123 of the wavelength selection element (etalon) 120 is the compound semiconductor. Accordingly, as compared with a case where the material of the base plate is $SiO_2$, the length D of the base plate 123 can be shortened, and the apparatus can be miniaturized.

According to the optical module 2, the wavelength selection element (etalon) 120 and the semiconductor laser (light source) 110 are formed on the substrate 170. The apparatus can be miniaturized by monolithically forming the wavelength selection element 120 and the semiconductor laser 110 on the substrate 170 as discussed above.

According to the optical module 2, as described above, the base plate 123 of the wavelength selection element (etalon) 120 is the optical waveguide. Accordingly, the beam diameter of the light L2 emitted from the wavelength selection element 120 can be controlled, and the light can be efficiently irradiated to the gas cell 130.

According to the optical module 2, the light source 10 is the surface emitting laser. In the surface emitting laser, since a current for causing a gain is small as compared with the edge emitting laser, the power consumption can be reduced.

The atomic oscillator 1 includes the optical module 2. Accordingly, the frequency stability can be improved as discussed above.

Note that the foregoing embodiments are examples, and no limitation is made to these embodiments.

Figure 6:
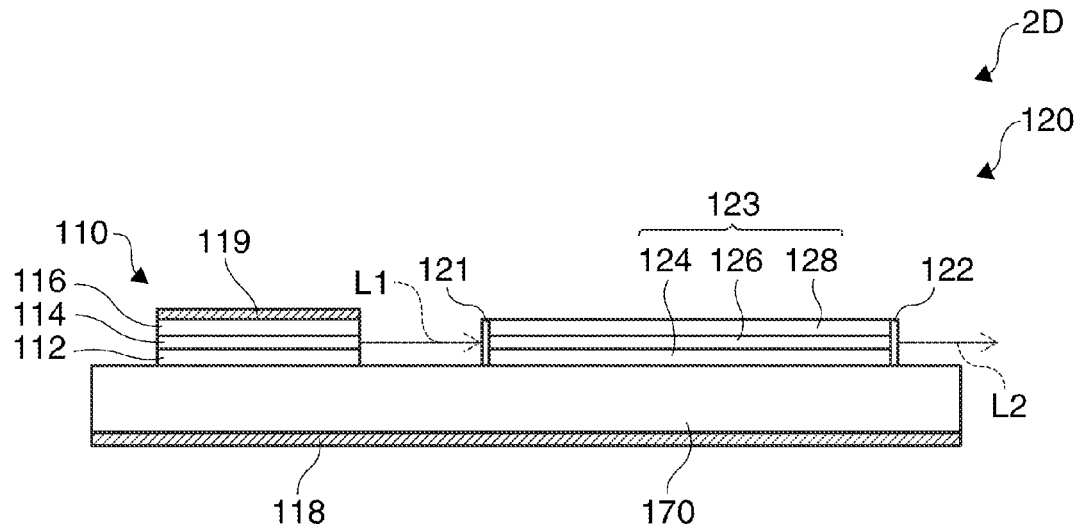
FIG. 6 is a sectional view schematically showing part of an optical module using an edge emitting laser.

For example, although the semiconductor laser 110 shown in FIG. 5 is the surface emitting laser, the semiconductor laser may be an edge emitting laser. FIG. 6 is a sectional view schematically showing part of an optical module 2D using an edge emitting laser. Hereinafter, in the optical module 2D shown in FIG. 6, the same structure as the structure of the optical module 2 shown in FIG. 5 is denoted by the same reference numeral and its description is omitted.

A first semiconductor layer 112 is formed on a substrate 170. As the first semiconductor layer 112, for example, a first conductivity type (for example, n type) AlGaAs layer can be used.

An active layer 114 is formed on the first semiconductor layer 112. The active layer 114 has a multiple quantum well (MQW) structure in which three quantum well structures each including a GaAs well layer and an AlGaAs barrier layer overlap.

A second semiconductor layer 116 is formed on the active layer 114. As the second semiconductor layer 116, for example, a second conductivity type (for example, p type) AlGaAs layer can be used.

For example, a pin diode is composed of the p-type second semiconductor layer 116, the active layer 114 not doped with impurity and the n-type first semiconductor layer 112. Each of the second semiconductor layer 116 and the first semiconductor layer 112 is a layer having a larger forbidden band width and a smaller refractive index than those of the active layer 114. The active layer 114 functions to amplify the light. The first semiconductor layer 112 and the second semiconductor layer 116 are disposed at both sides of the active layer 114 and function to confine injection carriers (electrons and holes) and light.

In the semiconductor laser 110, when a forward bias voltage of the pin diode is applied between a first electrode 118 and a second electrode 119, recombination of an electron and a hole occurs in the active layer 114. Light emission occurs by this recombination. Stimulated emission occurs successively from a start point where the light is generated, and the light intensity is amplified. When the light gain becomes larger than the light loss, laser oscillation occurs, laser light is generated, and the laser light (first light L1) is emitted from the side surface of the active layer 114.

When the edge emitting laser is used as the semiconductor laser 110, the laser light can be emitted vertically to the laminate direction of the respective layers 112, 114 and 116 of the semiconductor laser 110. Accordingly, alignment between the semiconductor laser 110 and the wavelength selection element 120 can be performed by controlling the film thicknesses of the respective layers 112, 114 and 116. Further, for example, an optical element, such as a prism, for causing the laser light to be incident on the wavelength selection element 120 formed on the same substrate 170 becomes unnecessary. Accordingly, the alignment accuracy between the semiconductor laser 110 and the wavelength selection unit 120 can be improved.

As described above, although the embodiments of the invention are described in detail, it would be easily understood by a person skilled in the art that many modifications can be made without substantially departing from the scope and effect of the invention. Accordingly, these modifications are included in the scope of the invention.

What is claimed is:

1. An optical module of an atomic oscillator using a quantum interference effect, comprising:
   a light source generating first light, the first light including a fundamental wave having a center wavelength, and the first light including a first sideband wave and a second sideband wave, the first and second sideband waves having wavelengths that are different from each other;
   a wavelength selection unit that emits second light by selecting the first sideband wave and the second sideband wave of the first light and by allowing them to pass therethrough while reducing or eliminating the fundamental wave;
   a gas cell in which an alkali metal gas is sealed and to which the second light is irradiated; and
   a light detection unit that detects an intensity of the second light passing through the gas cell.

2. The optical module according to claim 1, wherein the wavelength selection unit is an etalon.

3. The optical module according to claim 2, wherein
   the etalon includes a first mirror and a second mirror that reflect the first light and that face each other, and a base plate disposed between the first mirror and the second mirror, and
   the base plate is made of a compound semiconductor material.

4. The optical module according to claim 3, further comprising a substrate, wherein
   the substrate is made of a compound semiconductor material,
   the light source is a semiconductor laser, and
   the etalon and the light source are provided on the substrate.

5. The optical module according to claim 4, wherein
   the base plate of the etalon includes a first layer, a second layer and a third layer in this order from a side of the substrate,
   a refractive index of the first layer and a refractive index of the third layer are smaller than a refractive index of the second layer, and
   the second layer transmits the first light.

6. The optical module according to claim 1, wherein the light source is an edge emitting laser.

7. The optical module according to claim 1, wherein the light source is a surface emitting laser.

8. The optical module according to claim 1, wherein the wavelength selection unit is a fiber grating.

9. An atomic oscillator comprising the optical module according to claim 1.

10. An atomic oscillator comprising the optical module according to claim 2.

11. An atomic oscillator comprising the optical module according to claim 3.

12. An atomic oscillator comprising the optical module according to claim 4.

13. An atomic oscillator comprising the optical module according to claim 5.

14. An atomic oscillator comprising the optical module according to claim 6.

15. An atomic oscillator comprising the optical module according to claim 7.

16. An atomic oscillator comprising the optical module according to claim 8.

* * * * *